United States Patent
Beswick

Patent Number: 5,879,449
Date of Patent: Mar. 9, 1999

[54] CRYSTAL GROWTH

[75] Inventor: John Alfred Beswick, Malvern, United Kingdom

[73] Assignee: The Secretary of State for Defence in Her Britannic Majesty's Government of the United Kingdom of Great Britain and Northern Ireland, United Kingdom

[21] Appl. No.: 750,871
[22] PCT Filed: Jun. 6, 1995
[86] PCT No.: PCT/GB95/01305
 § 371 Date: Dec. 20, 1996
 § 102(e) Date: Dec. 20, 1996
[87] PCT Pub. No.: WO96/00317
 PCT Pub. Date: Jan. 4, 1996

[30] Foreign Application Priority Data

Jun. 23, 1994 [GB] United Kingdom .................. 9412629

[51] Int. Cl.$^6$ ......................................... C30B 35/00
[52] U.S. Cl. .................. 117/30; 117/31; 117/200; 117/213
[58] Field of Search ................... 117/18, 30, 31, 117/54, 200, 206, 213, 214

[56] References Cited

U.S. PATENT DOCUMENTS

| | | | |
|---|---|---|---|
| 4,264,385 | 4/1981 | Fisher | 106/31.17 |
| 4,454,096 | 6/1984 | Lorenzini et al. | 117/18 |
| 4,609,425 | 9/1986 | Mateika et al. | 117/31 |
| 4,874,458 | 10/1989 | Nishizawa | 117/18 |
| 5,047,112 | 9/1991 | Ciszek | 117/18 |
| 5,292,487 | 3/1994 | Tatsumi et al. | 117/201 |

FOREIGN PATENT DOCUMENTS

| | | |
|---|---|---|
| 0226794 | 11/1986 | European Pat. Off. . |
| A0321576 | 6/1988 | European Pat. Off. . |
| 0364899 | 10/1989 | European Pat. Off. . |
| A525765 | 7/1992 | European Pat. Off. . |
| 402160690A | 6/1990 | Japan ................ 117/217 |

Primary Examiner—Felisa Garrett-Hiteshew
Attorney, Agent, or Firm—Nixon & Vanderhye

[57] ABSTRACT

Homogeneous crystals are grown from a multicomponent melt double crucible assembly with an injector which affords improved flow of melt from the outer to the inner crucible. Guide rods are provided external to the outer crucible and locate the inner crucible with reduced probability of sticking. Means are also provided for withdrawing the inner crucible after crystal growth is complete as is a method of removing trapped gas from the apparatus prior to crystal growth.

6 Claims, 4 Drawing Sheets

CRYSTAL GROWTH

This is a 35 U.S.C. 371 of PCT/GB95/01305 filed Jun. 6, 1995.

This invention relates to a method of growing crystals of uniform composition.

BACKGROUND OF THE INVENTION

The growth of low defect single crystals has been the subject of considerable research in for example the semiconductor industry. Such crystals are an essential precursor in the fabrication of a vast variety of semiconductor devices.

The Czochralski seed-pulling technique for growing single crystals is well known (eg Z Physik. Chem. (Liebzig) 92, 219 (1918)). By this technique a seed crystal is brought into contact with molten material (melt) to facilitate further crystallisation. The crystal so produced is drawn from the melt as it grows.

However, for an incongruently solidifying melt of more than one component (where the liquidus and solidus temperatures are different) this method does not give rise to uniform composition throughout the crystal. This is because the composition of crystal which crystalises from a given melt is different in composition from that melt (see, for example, S Glasstone, "The Elements of Physical Chemistry" p384, published by Macmillan, 1956). Hence, for a closed system, the composition of the melt, and hence the growing crystal changes as crystallisation proceeds.

In order to produce crystals of uniform composition, the double crucible technique was developed (eg Journal of Applied Physics, 29, no. 8, (1958) pp1241–1244 and U.S. Pat. No. 5,047,112).

Typically, the apparatus of this technique comprises an outer crucible containing melt of the same composition as the crystal to be grown. An inner crucible floats on the melt in the outer crucible and a small channel through the bottom or side wall of the inner crucible allows melt to flow in from the outer crucible.

The crystal is drawn from the melt in the inner crucible (which is replenished from the outer crucible via the channel) and, under equilibrium conditions, has the same composition as the molten material in the outer crucible.

Typically, the respective melting points of the contents of each crucible are different and an essential feature of the double crucible technique (as applied to an incongruently solidifying melt) is that a temperature differential must be maintained between the outer and inner crucible: the temperature at which the crystal is drawn from the melt in the inner crucible is lower than that required to keep the melt in the outer crucible molten.

For a given melt composition, the temperature differential achieved depends, inter alia, on the dimensions of each crucible (including wall and base thickness), the thermal conductivity of the crucible material, and the power and configuration of the heat source used to achieve melting.

One consequence of the difference in melting points between the respective contents of the two crucibles and of the temperature differential maintained between the two crucibles, is that the melt tends to freeze as it passes through the channel to the inner crucible. The resulting blockage is one of the major problems encountered when using the floating crucible technique with incongruently solidifying melts.

The tendency for freezing to block the hole can be reduced by increasing its diameter but this increases the tendency for diffusion of the melt in the inner crucible back into the outer crucible (see for example G R Blackwell, Solid State Electronics 7 105 (1964)). When this occurs, the composition of melt in the outer crucible no longer remains constant and hence the composition of the crystal produced is no longer uniform.

Another feature of the floating crucible technique is that the inner crucible must be maintained concentric with the outer crucible if a symmetrical temperature distribution across the system is to be maintained. If the inner crucible drifts toward the walls of the outer crucible then undesirable localised freezing of the outer melt is likely.

In response to this problem, inner crucibles have been designed which incorporate spacers or fenders to ensure they remain substantially concentric with the outer crucible. However, this design gives rise to another problem, namely that of sticking of the inner crucible. As crystal growth proceeds, the level of melt in the outer crucible falls and the floating inner crucible falls with it. With the incorporation of fenders or spacers on the inner crucible there is an increased tendency for the inner crucible to stick giving rise to uneven crystal growth or, in extreme cases, halting the growth process altogether.

Another disadvantage of the double crucible technique is that, after crystal growth is complete, residual melt may cool and solidify in the double crucible assembly fusing the two crucibles together. This causes many crucibles to be broken or discarded. Ideally, the two crucibles would be separated before cooling and solidification takes place but crystal growth normally takes place at elevated temperatures and the double crucible assembly is typically maintained in an enclosed, inert atmosphere during growth in order to prevent the components of the melt being oxidised or otherwise degraded. Therefore manual separation of the two crucibles before cooling is difficult without exposing the residual melt to the outside atmosphere.

Another problem commonly encountered when using the double crucible technique is that after charging both crucibles with appropriate melt, gas is often trapped in the channel for allowing melt to pass into the inner crucible and surface tension at the melt-gas interface prevents flow of melt from the outer to the inner crucible.

DESCRIPTION OF THE INVENTION

The current invention offers a solution to the above problems by providing means for reducing the drop in temperature experienced by the melt as it passes through the channel to the inner crucible. This means takes the form of an injector which has the additional advantage that it can be removed and replaced if required. The problem of sticking of the inner crucible is reduced by incorporating locating means which are external to the outer crucible and the problem of residual melt solidifying in the crucibles is reduced by including means for withdrawing the inner crucible immediately after crystal growth is complete. Another aspect of the invention comprises a method of removing trapped gas from the channel in the inner crucible in order to facilitate flow of melt from the outer to the inner crucible.

According to this invention, apparatus for growing crystals comprises a first crucible for containing a supply of molten material, a second crucible being adapted for floating on the molten material within the first crucible and having means for allowing molten material to enter from the first crucible, means for heating the contents of the first crucible and means for drawing a growing crystal from the melt in the second crucible, characterised in that the means for allowing molten material to enter the first crucible comprises an injector formed from material of higher thermal conductivity than the material used to form the second crucible and configured to provide relatively high thermal contact with the molten material in the first crucible and relatively low thermal contact with the material in the second crucible.

In a preferred embodiment, the injector is removable.

In a further preferred embodiment, a sealant is used to improve the seal between the injector and the inner crucible.

A further preferred embodiment includes locating means, outside the first crucible, for controlling the distance between the walls of the two crucibles.

In a further preferred embodiment the means for drawing the growing crystal comprises a vertically adjustable pull rod linked to the second crucible such that further raising of the pull rod after crystal growth is complete causes the second crucible to be withdrawn from the first crucible.

According to another aspect of this invention, an improvement to the double crucible technique for crystal growth comprises the steps of:

enclosing the double crucible assembly, including melts contained in the first and second crucibles, in a gas-tight chamber;

reducing the pressure of the chamber to remove trapped gas from the channel in the second crucible and repressurising the chamber.

BRIEF DESCRIPTION OF THE INVENTION

The invention will now be described, by example only, with reference to the following figures in which.

DETAILED DESCRIPTION OF THE INVENTION

Figure 1:
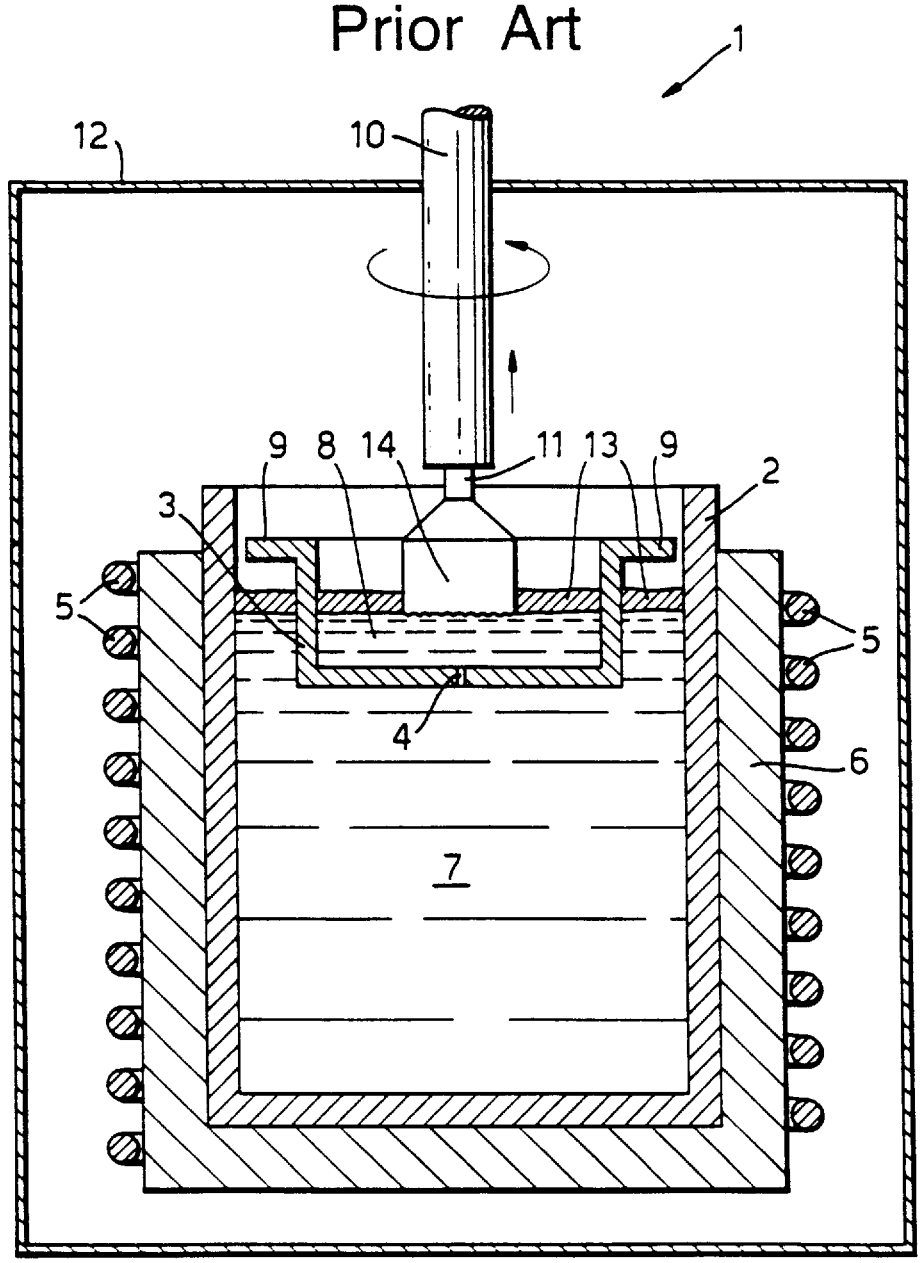
FIG. 1 is a diagram representing equipment of the prior art typically used in the double crucible method of crystal growth.

Referring to FIG. 1, a typical double crucible apparatus 1 includes a first (outer) crucible 2 and a second (inner) crucible 3. Crucibles 2 and 3 are formed from an inert material such as quartz, borosilicate glass, boron nitride or vitreous carbon. A narrow channel 4 is included in inner crucible 3.

Material of the composition desired in the finished crystal is placed in the outer crucible 2 and heated by rf induction coil 5 via susceptor 6 to produce outer melt 7.

The inner crucible 3 is placed on the outer melt 7 and typically is initially charged with material which, after heating to form melt 8, will solidify to form crystals of the desired composition.

During the initial stages of the process, gas which is trapped in channel 4 may prevent or inhibit the flow of melt 7 into inner crucible 3.

Spacers 9 maintain the inner crucible 3 substantially concentric with the outer crucible 2.

The floating crucible apparatus typically includes a vertically adjustable and rotatable pull rod 10 to which a seed crystal 11 is secured by mechanical means such as clamping or wire fastening.

The apparatus may include walls defining a chamber 12 which may be filled to a high pressure with an inert gas such as argon. Alternatively, chamber 12 may be evacuated.

Under certain circumstances, the more volatile components of certain melts tend to be depleted by evaporation. This loss can be reduced by means of an encapsulation layer 13 of, for example, $B_2O_3$ (eg see GB 1,113,069).

During operation, the pull rod 10 is lowered so that seed crystal 11 is brought onto contact with inner melt 8 and crystallisation is facilitated. As the crystal 14 grows it is rotated and drawn up and out of the inner melt 8 by pull rod 10. As the inner melt is depleted by crystallisation, new melt enters through channel 4 and, under equilibrium conditions, the new melt so entering has the same composition as the growing crystal.

Figure 2:
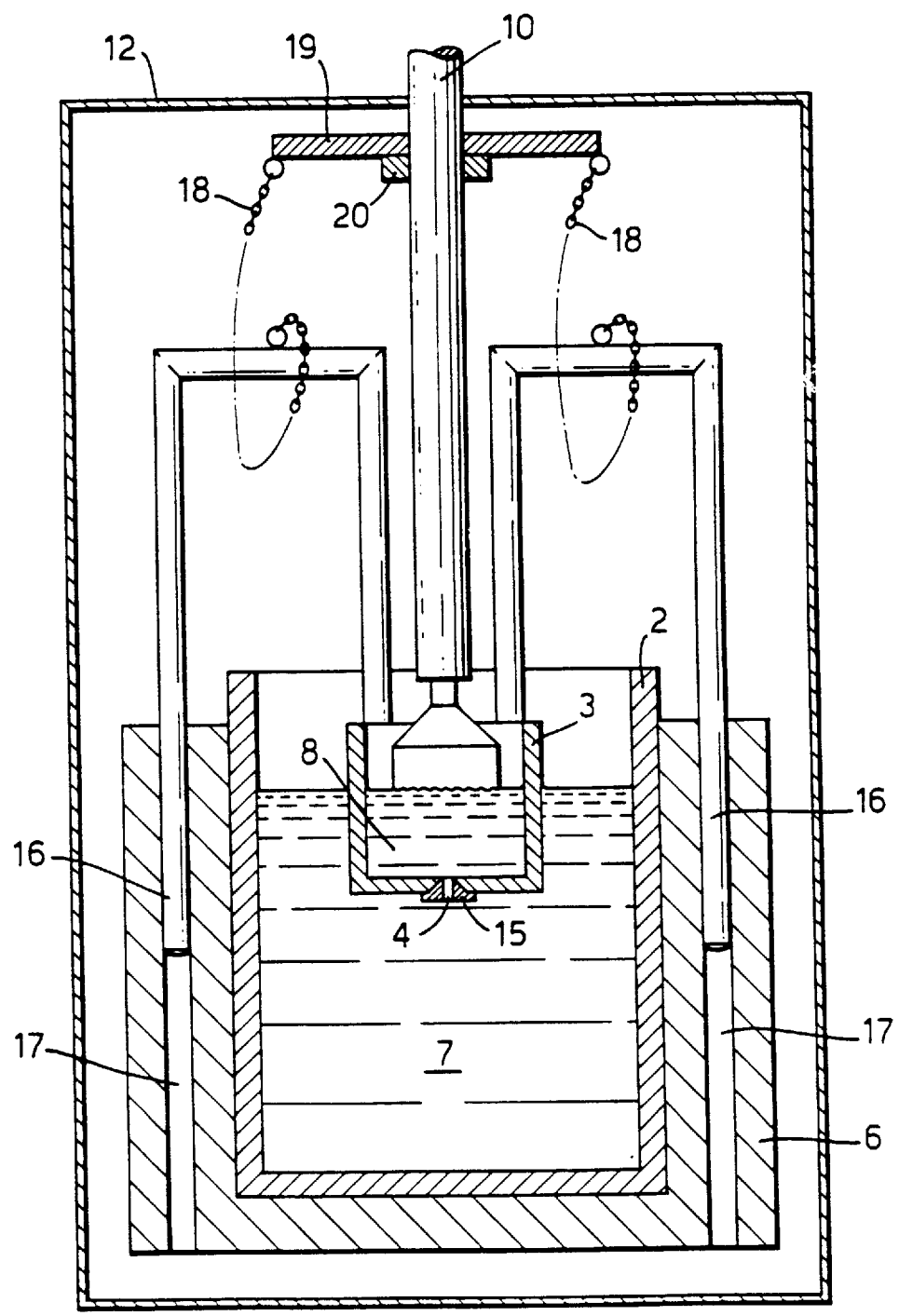
FIG. 2 is a part representation of apparatus incorporating the features of the current invention.

Referring to FIG. 2, some of the features which are common to the prior art have been omitted. In this embodiment crucibles 2 and 3 are formed from quartz. Outer melt 7 enters inner crucible 3 through injector 15.

After melts 7 and 8 have been formed, chamber 12 is evacuated to a pressure sufficiently low to effect removal of trapped gas from channel 4. The vacuum necessary to remove the gas depends on, inter alia, the viscosity of the melts 7 and 8 and the ambient pressure and is typically less than 100 $Nm^{-2}$.

After the gas has been removed from channel 4 chamber 12 is restored to the conditions under which crystal growth takes place.

Inner crucible 3 is maintained substantially concentric with outer crucible 2 by three equispaced guide rods 16 (two shown), attached to inner crucible 3 and locating in holes 17. In this particular embodiment, locating holes 17 are situated in susceptor 6. However other arrangements, where the means for locating the inner crucible 3 is outside the outer crucible 2, will be apparent to those skilled in the art.

Inner crucible 3 is linked to pull rod 10 via light chains 18 attached to plate 19. Pull rod 10 is free to rotate independently of plate 19 through which it passes. The position of plate 19 along pull rod 10 is maintained by stop 20. The length of the chains 18 is such that, by the time crystal growth is complete, substantially all of the slack has been taken up and further raising of pull rod 10 causes withdrawal of the inner crucible 3 and guide rods 16. Other arrangements, where further raising of pull rod 10 after crystal growth is complete will effect withdrawal of inner crucible 3 from outer crucible 2, will be apparent to those skilled in the art.

Figure 3A:
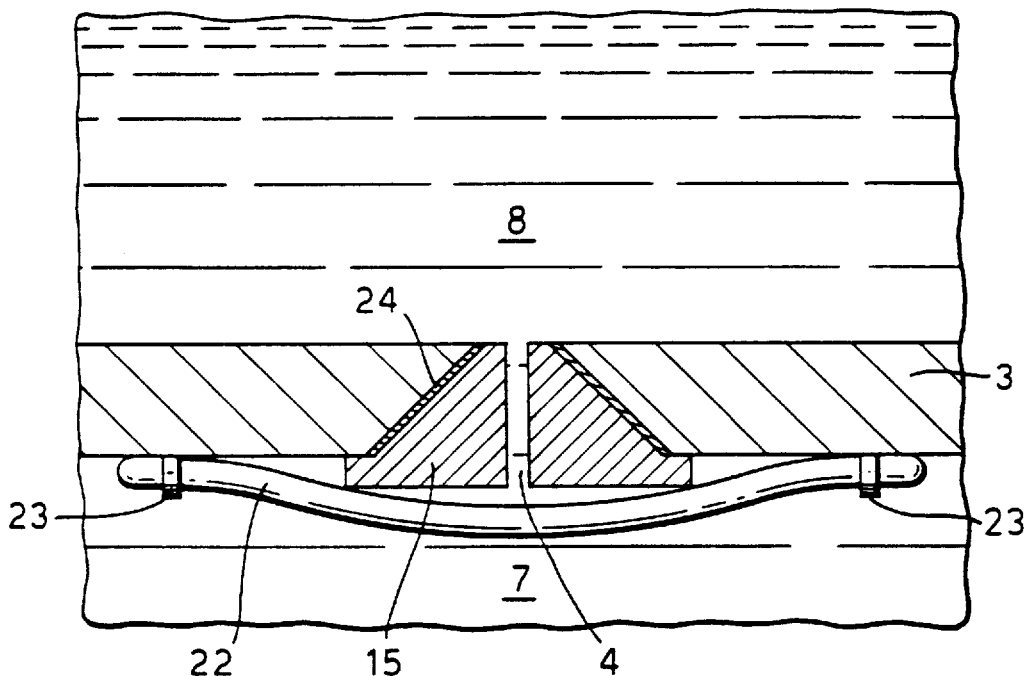
FIGS. 3a and 3b are respectively schematic cross-section and a view from below of a typical injector used in the current invention and FIG. 4 is a part representation of an alternative double crucible arrangement incorporating features of the current invention.
Figure 3B:
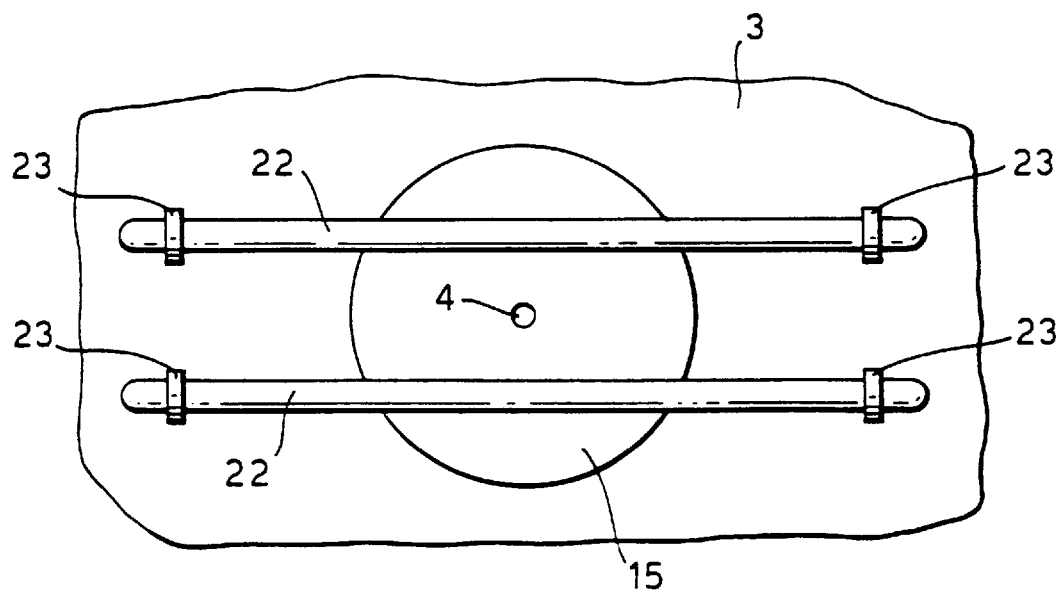

Referring to FIGS. 3a and 3b injector 15 is set in the wall or floor of inner crucible 3 and is formed from a material of high conductivity, in this embodiment, graphite. The injector 15 includes a channel 4 and is substantially conical in shape with a flange at one end so that the thermal contact with the outer melt 7 is significantly greater than with the inner melt 8. Thus, the reduction in temperature experienced by the outer melt 7 as it flows through the channel 4 is reduced.

Injector 15 is held in place by quartz rods 22 located in eyes 23. Quartz rods 22 are typically about 2–3 cm long with a cross-sectional diameter of about 1–2 mm and at these dimensions exhibit significant flexibility and resilience.

Injector 15 is removable and, as an alternative to the evacuation procedure detailed above for removing trapped gas from channel 4, it may be removed and filled with melt material before assembly of the apparatus.

Other injector configurations, which give rise to a higher thermal contact with the outer melt 7 than with the inner melt 8, will be apparent to those skilled in the art.

The seal between the injector 15 and the wall of the inner crucible 3 may be improved by use of an appropriate sealant 24, for example graphite paper.

Figure 4:
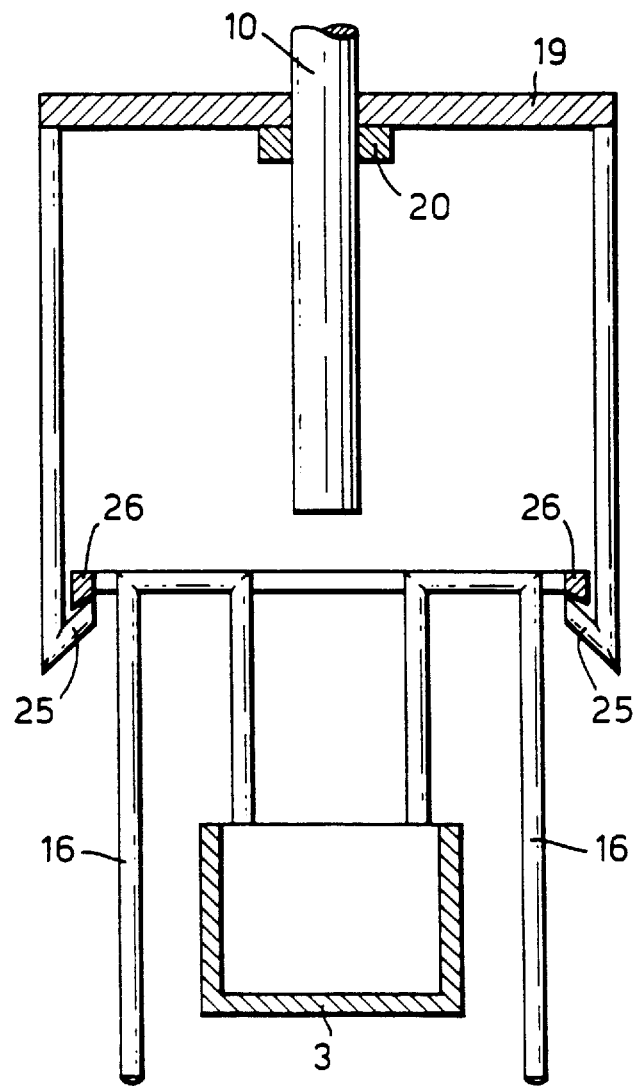

Referring to FIG. 4, when pull rod 10 is raised to a predetermined height (as shown) hooks 25, which are connected to pull rod 10 via plate 19, engage with ring 26 which is attached to guide rods 16. Thus, further raising of pull rod 10 causes inner crucible 3 to be raised. Pull rod 10 is free to rotate independently of plate 19 through which it passes. The position of plate 19 along pull rod 10 is maintained by stop 20. This arrangement has the additional advantage that, during operation, the inner crucible 3 may be rotated independently of the link to plate 19.

I claim:

1. A method of growing a crystal using a double crucible technique for crystal growth and including the steps of:

enclosing the double crucible assembly, including melts contained in the first and second crucibles, in a gas-tight chamber;

reducing the pressure of the chamber to remove trapped gas from the channel in the second crucible and repressurising the chamber.

2. An apparatus for growing crystals having a crystal diameter comprising:

a first crucible for containing a supply of molten material, a second crucible adapted for floating on the molten material within the first crucible and having means for allowing molten material to enter from the first crucible, means for heating the contents of the first crucible, and means for drawing a growing crystal from the melt in the second crucible, wherein the means for allowing molten material to enter the first crucible comprises an injector, the injector arranged such that the crystal is grown remotely from the injector and the diameter of the growing crystal is independent of injector size and wherein the injector is formed from material of higher thermal conductivity than the material used to form the second crucible and configured to provide relatively high thermal contact with the molten material in the first crucible and relatively low thermal contact with the material in the second crucible.

3. The apparatus of claim 2 where the injector is removable.

4. The apparatus of claim 2 where a sealant is used to improve the seal between the injector and the inner crucible.

5. The apparatus of claim 2 and further including locating means, outside the first crucible, for controlling a distance between the walls of the two crucibles.

6. The apparatus of claim 2 where the means for drawing a growing crystal comprises a vertically adjustable pull rod linked to the second crucible such that further raising of the pull rod after crystal growth is complete causes the second crucible to be withdrawn from the first crucible.

\* \* \* \* \*